US009644274B2

(12) United States Patent
Tamai et al.

(10) Patent No.: US 9,644,274 B2
(45) Date of Patent: May 9, 2017

(54) ETCHING SOLUTION FOR COPPER OR A COMPOUND COMPRISED MAINLY OF COPPER

(75) Inventors: Satoshi Tamai, Tokyo (JP); Kunio Yube, Tokyo (JP); Satoshi Okabe, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/130,779

(22) PCT Filed: Jun. 28, 2012

(86) PCT No.: PCT/JP2012/066533
§ 371 (c)(1),
(2), (4) Date: Jan. 3, 2014

(87) PCT Pub. No.: WO2013/005631
PCT Pub. Date: Jan. 10, 2013

(65) Prior Publication Data
US 2014/0131615 A1 May 15, 2014

(30) Foreign Application Priority Data

Jul. 4, 2011 (JP) .................................. 2011-148542

(51) Int. Cl.
| | | |
|---|---|---|
| C03C 15/00 | (2006.01) | |
| C23F 1/18 | (2006.01) | |
| C23F 1/26 | (2006.01) | |
| H01L 21/3213 | (2006.01) | |
| C23F 1/44 | (2006.01) | |
| C09K 13/04 | (2006.01) | |
| H05K 3/06 | (2006.01) | |
| C23F 1/16 | (2006.01) | |

(52) U.S. Cl.
CPC ............. C23F 1/18 (2013.01); C09K 13/04 (2013.01); C23F 1/16 (2013.01); C23F 1/26 (2013.01); C23F 1/44 (2013.01); H01L 21/32134 (2013.01); H05K 3/067 (2013.01); H05K 2201/0338 (2013.01)

(58) Field of Classification Search
CPC ...... C23F 1/14; C23F 1/26; C23F 1/18; H01L 21/32134
USPC ................ 252/79.4, 79.1; 216/100, 105, 106
See application file for complete search history.

(56) References Cited

U.S. PATENT DOCUMENTS

| | | | | |
|---|---|---|---|---|
| 6,426,020 B1* | 7/2002 | Okada et al. | ................. | 252/79.1 |
| 2004/0118814 A1* | 6/2004 | Kim et al. | ...................... | 216/96 |
| 2005/0194565 A1* | 9/2005 | Kamiya | ................... | C09G 1/02 |
| | | | | 252/79.1 |
| 2005/0282384 A1* | 12/2005 | Nawafune | ............... | C23C 18/36 |
| | | | | 438/678 |
| 2006/0222613 A1* | 10/2006 | Teramoto | ................. | A61Q 5/04 |
| | | | | 424/70.5 |
| 2007/0138142 A1 | 6/2007 | Feng et al. | | |
| 2008/0035882 A1* | 2/2008 | Zhao | ..................... | B24B 37/044 |
| | | | | 252/79.4 |
| 2008/0041823 A1* | 2/2008 | La et al. | ......................... | 216/97 |
| 2009/0224200 A1* | 9/2009 | Jha | ........................... | C09G 1/02 |
| | | | | 252/79.2 |
| 2012/0024818 A1* | 2/2012 | Ono | ..................... | B24B 37/044 |
| | | | | 216/53 |
| 2013/0105729 A1* | 5/2013 | Tamai et al. | ................. | 252/79.4 |

FOREIGN PATENT DOCUMENTS

| | | | | |
|---|---|---|---|---|
| CN | 1120077 | | 4/1996 | |
| CN | 1782006 | | 6/2006 | |
| CN | 101778923 A | | 7/2010 | |
| JP | 47-31838 | | 11/1972 | |
| JP | 60-243286 | | 12/1985 | |
| JP | 61-000591 | | 1/1986 | |
| JP | 06-287774 | | 10/1994 | |
| JP | 2010-537042 | | 12/2000 | |
| JP | 2001-200380 | | 7/2001 | |
| JP | 2009-091656 | | 4/2009 | |
| JP | 2009144180 A | * | 7/2009 | |
| JP | WO 2010093011 A1 | * | 8/2010 | ........... B24B 37/044 |
| JP | 2011-017054 | | 1/2011 | |
| JP | 2011-084781 | | 4/2011 | |
| TW | 200420755 | | 10/2004 | |
| TW | 201105780 | | 2/2011 | |

OTHER PUBLICATIONS

Chemicalland 21, "Copper gluconate", via http://www.chemicalland21.com/lifescience/foco/COPPER%20GLUCONATE.htm ; 2 pages; Jan. 15, 2010.*
Kear, Fred W., "Printed Circuit Assembly Manufacturing", Marcel Dekker, Inc., p. 140, 1987.
Metallov, Z., vol. 23, No. 2, p. 295-7, 1987.
International Search Report Issued Sep. 4, 2012 in PCT/JP12/066533 Filed Jun. 28, 2012.
International Preliminary Report on Patentability and Written Opinion issued Jan. 16, 2014 in PCT/JP2012/066533 (English Translation).
Chinese Office Action issued on Dec. 15, 2015 in Patent Application No. 201280032769.0.
Combined Taiwanese Office Action and Search Report issued on Nov. 24, 2015 in Patent Application No. 101123882.

* cited by examiner

*Primary Examiner* — Binh X Tran
(74) *Attorney, Agent, or Firm* — Oblon, McClelland, Maier & Neustadt, L.L.P.

(57) ABSTRACT

The present invention relates to an etching solution for copper or a compound comprised mainly of copper, wherein the etching solution contains (A) a maleic acid ion source and (B) a copper ion source, and an etching method using the etching solution.

11 Claims, No Drawings

ETCHING SOLUTION FOR COPPER OR A COMPOUND COMPRISED MAINLY OF COPPER

CROSS REFERENCE TO RELATED APPLICATIONS

The present application is a 35 U.S.C. §371 national stage patent application of International patent application PCT/JP2012/066533, filed on Jun. 28, 2012, published as WO/2013/005631 on Jan. 10, 2013, the text of which is incorporated by reference, and claims the benefit of the filing date of Japanese application no. 2011-148542, filed on Jul. 4, 2011, the text of which is also incorporated by reference.

TECHNICAL FIELD

The present invention relates to an etching solution for copper or a compound comprised mainly of copper and an etching method using the same for etching copper or a compound comprised mainly of copper.

BACKGROUND ART

Conventionally, aluminum or an aluminum alloy has been generally used as a wiring material for display devices such as a flat panel display. However, as the display is increased in size and improved in resolution, such a wiring comprised mainly of aluminum causes a problem of signal delay due to the properties of aluminum including high wiring resistance, making it difficult to achieve uniform image display. For this reason, studies are being made on the employment of a wiring comprised mainly of copper which is a material having a lower resistance than aluminum.

Copper has an advantage in that the resistance is low; however, copper also has problems in that when used in a gate wiring, the adhesion of copper to a substrate, such as glass, is not satisfactory, and in that when used in a source-drain wiring, diffusion of copper into the underlying silicon semiconductor film is likely to occur. For preventing the problems, studies are made on stacking a barrier film of a metal on copper, wherein the metal has both high adhesion to a substrate, such as glass, and barrier properties that diffusion of the metal into a silicon semiconductor film is unlikely to occur. As a metal for the barrier film, metals including molybdenum and titanium are studied, and a multilayer thin film structure comprising copper and the above metal or an alloy of the metal is employed.

A wiring comprised mainly of copper is formed in the form of a thin film on a substrate, such as glass, by a deposition process, such as a sputtering method, and then subjected to etching step in which the film is etched using, e.g., a resist as a mask, forming a wiring pattern. The etching step is classified into a wet etching method using an etching solution and a dry etching method using an etching gas, such as plasma.

As an etching solution for copper, an etching solution containing copper(II) ions and halide ions has been known. Such an etching solution has problems in that halide ions cause the apparatus to suffer corrosion, and in that the etching rate is too high to control the wiring form.

As an etching solution for copper or a multilayer film comprising copper, an alkaline etching solution containing copper(II) ions and ammonia has been known (see, for example, patent document 1 and non-patent documents 1 and 2). Such an etching solution containing ammonia poses problems in that, when ammonia is emitted from the etching solution, the reduction of the ammonia concentration in the etching solution causes changes of the etching rate or the odor of emitted ammonia causes the working environment to be worse. For this reason, an etching solution using, instead of ammonia, an amine having low emission properties, such as an alkanolamine, (see, for example, patent document 2) and an etching solution using an azole (see, for example, patent document 3) have also been known.

Further, as an etching solution for copper, an acidic etching solution containing hydrogen peroxide also has been known (see, for example, patent document 4). Furthermore, an acidic etching solution containing a persulfate instead of hydrogen peroxide has been known (see, for example, patent document 5). These solutions have a danger that when hydrogen peroxide or a persulfate causes a vigorous decomposition reaction, gas or heat is generated and causes breakage of the apparatus.

PRIOR ART REFERENCES

Patent Documents

Patent document 1: Japanese Unexamined Patent Publication No. Sho 60-243286
Patent document 2: Japanese Unexamined Patent Publication No. 2001-200380
Patent document 3: Japanese Unexamined Patent Publication No. 1994-287774
Patent document 4: Japanese Unexamined Patent Publication No. Sho 61-591
Patent document 5: Japanese Unexamined Patent Publication No. Sho 47-31838

Non-Patent Documents

Non-patent document 1: PRINTED CIRCUIT ASSEMBLY MANUFACTURING, Fred W. Kear, MARCELDEKKER, INC., Page 140, 1987
Non-patent document 2: Zashchita Metallov (1987), Vol. 23 (2), Page 295-7

SUMMARY OF THE INVENTION

Problems to be Solved by the Invention

An object of the present invention is to provide an etching solution for copper or a compound comprised mainly of copper, which is free of the above-mentioned problems accompanying the prior art, and an etching method using the same for etching copper or a compound comprised mainly of copper.

Means to Solve the Problems

The present inventors have conducted extensive and intensive studies with a view toward achieving the above object. As a result, it has been found that an etching solution having added thereto a maleic acid ion source and a copper ion source can achieve the object. The present invention has been completed, based on the above finding. Specifically, the gist of the present invention is as follows.

[1] An etching solution for copper or a compound comprised mainly of copper, wherein the etching solution contains (A) a maleic acid ion source and (B) a copper ion source.

[2] The etching solution according to item 1 above, which further contains (C) a source of organic acid ion having two or more carboxyl groups and one or more hydroxyl groups per molecule.

[3] The etching solution according to item 1 or 2 above, wherein the maleic acid ion source (A) is at least one member selected from among maleic acid, maleic anhydride, and an alkali metal maleate.

[4] The etching solution according to any one of items 1 to 3 above, wherein the copper ion source (B) is at least one member selected from among copper, copper hydroxide, copper sulfate, and copper nitrate.

[5] The etching solution according to any one of items 1 to 4 above, wherein the concentration of maleic acid ion in the etching solution is 0.01 to 2 mol/kg, the concentration of copper ion in the etching solution is 0.01 to 1 mol/kg, and the ratio (molar ratio) of the concentration of maleic acid ion to the concentration of copper ion is 0.01 to 50.

[6] The etching solution according to any one of items 2 to 5 above, wherein the source of organic acid ion having two or more carboxyl groups and one or more hydroxyl groups per molecule (C) is at least one member selected from among citric acid, tartaric acid, malic acid, and salts of thereof.

[7] The etching solution according to any one of items 2 to 6 above, wherein the ratio (molar ratio) of the amount of the source of organic acid ion having two or more carboxyl groups and one or more hydroxyl groups per molecule (C) to the amount of the copper ion source (B) is 0.1 to 2.0.

[8] The etching solution according to any one of items 1 to 7 above, which further contains a pH adjustor.

[9] The etching solution according to any one of items 1 to 8 above, which further has a pH of 0 to 9.

[10] The etching solution according to any one of items 1 to 9 above, which further contains (D) an ammonia and/or ammonium ion source.

[11] The etching solution according to any one of items 1 to 10 above, which further contains (E) a molybdenum and/or molybdic acid ion source.

[12] The etching solution according to any one of items 1 to 11 above, wherein the copper or compound comprised mainly of copper is a multilayer film comprising a thin film formed from copper or a compound comprised mainly of copper.

[13] The etching solution according to item 12 above, wherein the multilayer film has a two-layer structure comprising a thin film formed from copper or a compound comprised mainly of copper and a thin film formed from molybdenum or a compound comprised mainly of molybdenum, or has a three-layer structure comprising a thin film formed from molybdenum or a compound comprised mainly of molybdenum, a thin film formed from copper or a compound comprised mainly of copper, and a thin film formed from molybdenum or a compound comprised mainly of molybdenum.

[14] An etching method which comprises contacting copper or a compound comprised mainly of copper with the etching solution according to any one of items 1 to 13 above.

[15] The etching method according to item 14 above, wherein the copper or compound comprised mainly of copper is a multilayer film comprising a thin film formed from copper or a compound comprised mainly of copper.

[16] The etching method according to item 15 above, wherein the multilayer film has a two-layer structure comprising a thin film formed from copper or a compound comprised mainly of copper and a thin film formed from molybdenum or a compound comprised mainly of molybdenum, or has a three-layer structure comprising a thin film formed from molybdenum or a compound comprised mainly of molybdenum, a thin film formed from copper or a compound comprised mainly of copper, and a thin film formed from molybdenum or a compound comprised mainly of molybdenum.

Effect of the Invention

In the present invention, there can be provided an etching solution for copper or a compound comprised mainly of copper and an etching method using the same for etching copper or a compound comprised mainly of copper. The etching solution of the present invention can be used in, for example, a wiring formation process for a display device, such as a flat panel display. Further, when the etching solution is used in an etching step for a wiring having a multilayer structure comprising a thin film formed from copper or a compound comprised mainly of copper and a thin film formed from molybdenum or a molybdenum compound comprised mainly of molybdenum, the multilayer structure can be etched at the same time, so that a display device can be obtained with high productivity. Further, no etching residue or deposit is produced in the etching step, and therefore the etching solution can deal with the increase of size and the improvement of resolution of a display. Furthermore, for example, the etching solution can be used in a soft etching step for the surface of copper or a compound comprised mainly of copper in a printed circuit substrate.

Further, in the etching solution and etching method of the present invention, halide ions are not contained in the composition of the etching solution, and therefore the apparatus does not suffer corrosion due to halide ions. A halide, especially a fluorine compound is not contained, and hence, even when a material comprised of glass or amorphous silicon as a material around an object to be etched coexists, the material suffers no damage. Further, in the etching solution and etching method of the present invention, hydrogen peroxide is not contained in the composition of the etching solution, and therefore there is no danger that gas or heat is generated due to decomposition of peroxide. Therefore, etching can be safely and stably conducted.

MODE FOR CARRYING OUT THE INVENTION

[Etching Solution]

The etching solution of the present invention is used in etching copper or a compound comprised mainly of copper, and contains (A) a maleic acid ion source and (B) a copper ion source.

<(A) Maleic Acid Ion Source>

With respect to the maleic acid ion source (hereinafter, frequently referred to simply as "component (A)") used in the etching solution of the present invention, there is no particular limitation as long as it can provide maleic acid ions, but maleic acid, and maleates, such as sodium maleate and ammonium maleate, can be used individually or in combination. Further, maleic anhydride, which is an anhydride of maleic acid, is easily reacted with water to form maleic acid, and therefore maleic anhydride can be used. Of these, from the viewpoint of, e.g., ready availability, maleic acid, maleic anhydride, or disodium maleate is preferably used, and maleic anhydride is especially preferably used.

When using copper maleate as component (A), the copper maleate has a function of component (A) as well as a function of the below-mentioned copper ion source (B). The amount of component (A) added to the etching solution of the present invention is preferably in the range of from 0.01 to 2 mol/kg-etching solution, in terms of a concentration of maleic acid ion, more preferably 0.02 to 2 mol/kg-etching solution, further preferably 0.04 to 1.6 mol/kg-etching solution, especially preferably 0.06 to 1.4 mol/kg-etching solution.

<(B) Copper Ion Source>

With respect to the copper ion source (hereinafter, frequently referred to simply as "component (B)") used in the etching solution of the present invention, there is no particular limitation as long as it can generate copper(II) ions in the solution. Preferred examples of the copper ion source for obtaining excellent etching rate include copper salts, such as copper sulfate, copper nitrate, copper acetate, copper maleate, copper citrate, copper malate, copper tartrate, ammonium copper sulfate, and ammonium copper chloride (including solvates, particularly hydrates thereof), and these can be used individually or in combination. These copper salts can be dissociated in the solution to provide copper(II) ions. Alternatively, copper (metal) or a copper compound, such as copper oxide or copper hydroxide, can be chemically dissolved to provide copper(II) ions. These copper ion sources can be used individually or in combination, and, of these, more preferred are copper sulfate, copper nitrate, copper, and copper hydroxide, and especially preferred are copper sulfate, copper nitrate, and copper hydroxide.

When using copper maleate as component (B), the copper maleate has a function of component (B) as well as a function of the above-mentioned maleic acid ion source (A). Further, when using, e.g., copper citrate, copper malate, or copper tartrate as component (B), the copper citrate, copper malate, or copper tartrate has a function of component (B) as well as a function of the source of organic acid ion having two or more carboxyl groups and one or more hydroxyl groups per molecule (C), as mentioned below. The amount of component (B) added to the etching solution of the present invention is preferably in the range of from 0.01 to 1 mol/kg-etching solution, in terms of a concentration of copper ion, further preferably 0.02 to 0.9 mol/kg-etching solution, especially preferably 0.02 to 0.8 mol/kg-etching solution. When the amount of component (B) added is within the above range, excellent etching rate can be obtained.

<(C) Organic Acid Ion Source>

The etching solution of the present invention may contain (C) an organic acid ion source, in addition to the maleic acid ion source (A) and the copper ion source (B). The organic acid ion source (C) (hereinafter, frequently referred to simply as "component (C)") used in the etching solution of the present invention has an organic acid structure having two or more carboxyl groups and one or more hydroxyl groups per molecule. This organic acid ion source (C) has a role of ligand for copper ions, and, when the etching solution is used in etching copper or a compound comprised mainly of copper, the organic acid ion source has a function of controlling the etching rate and a function of controlling the stability of the etching solution. Further, when the etching solution is used in etching a structure comprising a thin film formed from copper or a compound comprised mainly of copper on a substrate, the organic acid ion source can suppress the generation of residue or deposit on the substrate upon rinsing the substrate with water after the etching. Preferred examples of the organic acid ion source (C) include mono- or dihydroxydicarboxylic acids, such as malic acid, tartaric acid, and citramalic acid; monohydroxytricarboxylic acids, such as citric acid and isocitric acid; hydroxysugar acids, such as glucaric acid and galactaric acid; and organic acids, such as carboxylic acids of hydroxyamine, and salts thereof (including solvates, particularly hydrates thereof), and these can be used individually or in combination. Of these, from the viewpoint of exhibiting stable solubility in the etching solution and suppressing the generation of residue or deposit on the substrate, preferred is mono- or dihydroxydicarboxylic acid or monohydroxytricarboxylic acid, and especially preferred is citric acid, malic acid, tartaric acid, or a salt of thereof.

Further, as component (C), a copper salt of the above-mentioned organic acid, for example, copper citrate, copper malate, or copper tartrate can be used. These copper salts of organic acids have a function of component (C) as well as a function of the above-mentioned copper ion source (B). The amount of component (C) added to the etching solution of the present invention is preferably in the range of from 0.01 to 1 mol/kg-etching solution, more preferably 0.02 to 0.8 mol/kg-etching solution, especially preferably 0.03 to 0.7 mol/kg-etching solution.

<Composition of the Etching Solution>

The amount of the maleic acid ion source (A) added to the etching solution of the present invention is the amount of component (A), but when the etching solution contains copper maleate as component (B), the amount of the maleic acid ion source (A) added is the total amount of component (A) and component (B). The ratio (molar ratio) of the concentration of maleic acid ion (A) to the concentration of copper ion (B) is preferably 0.01 to 50, more preferably 0.01 to 30, further preferably 0.1 to 20, especially preferably 1 to 15. When the amount of maleic acid ions contained in the etching solution of the present invention is within the above range, excellent etching rate (for example, about 0.1 to 1 μm/minute in a wiring formation process for a display device, such as a flat panel display) can be obtained.

When the etching solution of the present invention contains the organic acid ion source (C), the amount of component (C) added to the etching solution of the present invention is the amount of component (C), but when the etching solution contains copper salt of the organic acid ion source (C) as component (B), the amount of component (C) added is the total amount of component (C) and component (B). The ratio (molar ratio) of the amount of the organic acid ion source (C) to the amount of the copper ion source (B) is preferably 0.1 to 2.0, more preferably 0.15 to 1.5, especially preferably 0.2 to 1.0. When the amount of the organic acid ion source (C) added is too large, the etching rate is reduced. When the amount of the organic acid ions contained in the etching solution of the present invention is within the above range, the generation of residue or deposit on a substrate can be efficiently suppressed, obtaining excellent etching rate.

<pH Value>

In the etching solution of the present invention, for adjusting the pH, if necessary, a pH adjustor can be added to the etching solution. The pH value of the etching solution of the present invention is not limited, and can be adjusted for obtaining a desired etching rate. But when the pH value of the etching solution is smaller than 0, the etching rate is likely to be too high, and, when the pH value of the etching solution is larger than 9, the etching rate is likely to be lower than desired. Therefore, excellent etching rate can be obtained by adjusting the pH value of the etching solution preferably to 9 or less, more preferably 8 or less, especially preferably 7 or less. Further, when the pH value of the etching solution is smaller than 0, the etching rate for molybdenum is likely to be extremely low.

With respect to the pH adjustor, there is no particular limitation as long as it does not inhibit the effects of the etching solution, and examples of pH adjustors include inorganic acids, such as sulfuric acid and nitric acid; organic acids, such as acetic acid, maleic acid, citric acid, and tartaric acid; metal hydroxides, such as sodium hydroxide and potassium hydroxide; ammonia/ammonium compounds, such as ammonia and tetramethylammonium hydroxide; and amines, such as monoethanolamine, diethanolamine, and triethanolamine. Of these, preferred is sulfuric acid, maleic acid, citric acid, potassium hydroxide, or ammonia, and especially preferred is sulfuric acid, potassium hydroxide, or ammonia. Needless to say, maleic acid has a function of component (A) as well as a function of the pH adjustor, and citric acid has a function of component (C) as well as a function of the pH adjustor. When the pH value of the etching solution is 9 or less, emission of ammonia from the etching solution is suppressed, so that a danger that the etching solution has poor stability or causes the working environment to be poor, which is a problem caused in the prior art, can be prevented. The amount of the pH adjustor added is such an amount that the etching solution of the present invention has a desired pH value, and is appropriately determined depending on the other components including components (A) to (C).

<Other Components>

The etching solution of the present invention, if necessary, may contain (D) an ammonia and/or ammonium ion source (hereinafter, frequently referred to simply as "component (D)"). The ammonia and/or ammonium ion source (D) used in the etching solution of the present invention has a role of ligand for copper ions, and, when the etching solution is used in etching copper or a compound comprised mainly of copper, the ammonia and/or ammonium ion source has a function of controlling the etching rate and a function of controlling the stability of the etching solution. With respect to component (D), there is no particular limitation as long as it can provide ammonia and/or ammonium ions, and ammonia or an ammonium salt can be used. Examples of ammonium salts include ammonium sulfate, ammonium nitrate, ammonium carbonate, ammonium acetate, ammonium maleate, ammonium citrate, ammonium tartrate, and ammonium malate, and these can be used individually or in combination. Of these, preferred are ammonia, ammonium sulfate, ammonium nitrate, ammonium acetate, ammonium maleate, and ammonium citrate, and especially preferred are ammonia, ammonium sulfate, ammonium nitrate, and ammonium acetate.

Needless to say, ammonium maleate has a function of component (D) as well as a function of component (A); e.g., ammonium copper sulfate has a function of component (D) as well as a function of component (B); and, e.g., ammonium citrate, ammonium tartrate, or ammonium malate has a function of component (D) as well as a function of component (C). Further, ammonia has a function of component (D) as well as a function of the pH adjustor. The amount of component (D) added to the etching solution of the present invention is preferably in the range of from 0.001 to 20 mol/kg-etching solution, in terms of the total of a concentration of ammonia and a concentration of ammonium ion, more preferably 0.005 to 15 mol/kg-etching solution, especially preferably 0.01 to 10 mol/kg-etching solution.

In the etching solution of the present invention, if necessary, (E) a molybdenum ion and/or molybdic acid ion source (hereinafter, frequently referred to simply as "component (E)") can be added. The molybdenum ion and/or molybdic acid ion source (E) has a function of controlling the etching rate. When the etching solution of the present invention is used in, for example, an etching step for a lamination layer structure comprising a thin film formed from copper or a compound comprised mainly of copper and a thin film formed from molybdenum or a compound comprised mainly of molybdenum, the molybdenum or compound comprised mainly of molybdenum is dissolved to increase the concentration of molybdenum ions and/or molybdic acid ions in the etching solution. However, by adding component (E) to the etching solution in advance, an effect is obtained in which a change of the etching rate caused by the increase of the concentration of molybdenum ions and/or molybdic acid ions in the etching solution can be reduced.

With respect to component (E), there is no particular limitation as long as molybdenum ions and/or molybdic acid ions can be provided. Further, it has been known that various ionic species of molybdic acid ions are present, but there is no particular limitation as long as molybdic acid ions of an ionic species soluble in the etching solution can be provided. Isopolymolybdic acid ions, such as orthomolybdic acid ions having one molybdenum atom in the ion, or paramolybdic acid ions having seven molybdenum atoms in the ion, or heteropolymolybdic acid ions having a heteroatom in the ion may be provided, or a combination of these ionic species may be provided. Preferred examples of components (E) include molybdenum; molybdates, such as ammonium molybdate, sodium molybdate, and potassium molybdate; heteropolymolybdates, such as ammonium phosphomolybdate and ammonium silicomolybdate; oxides and hydroxides, such as molybdenum oxide and molybdenum blue; and molybdenum sulfide, and these can be used individually or in combination. Of these, more preferred are molybdenum, ammonium molybdate, sodium molybdate, potassium molybdate, and molybdenum oxide, and especially preferred are molybdenum, ammonium molybdate, and molybdenum oxide.

The amount of the molybdenum ion and/or molybdic acid ion source (E) added to the etching solution of the present invention is determined in terms of the amount of orthomolybdic acid ions having one molybdenum atom in the ion. For example, when a paramolybdate having seven molybdenum atoms in the ion is used, the amount of component (E) is determined as 7 times the amount of the paramolybdate added. The amount of component (E) added to the etching solution of the present invention is preferably in the range of from $1 \times 10^{-6}$ to $1 \times 10^{-1}$ mol/kg-etching solution, in terms of orthomolybdic acid ions, more preferably $1 \times 10^{-5}$ to $5 \times 10^{-2}$ mol/kg-etching solution, especially preferably $1 \times 10^{-4}$ to $3 \times 10^{-2}$ mol/kg-etching solution. When the amount of component (E) added is within the above range, excellent etching rate can be obtained. Further, when component (E) is added so that the ratio (molar ratio) of the amount of the molybdenum and/or molybdic acid ion source (E) to the amount of the copper ion source (B) becomes equivalent to the molar ratio of copper ions to molybdenum or molybdic acid ions dissolved in the etching solution in the etching step, a change of the etching properties caused by the dissolution of copper and molybdenum can be reduced.

In addition to the above-mentioned components (A) to (C) and the pH adjustor optionally added, the etching solution of the present invention can contain water and other various additives generally used in the etching solution in such an amount that the effects of the etching solution are not sacrificed. As water, preferred is distilled water, ion-exchanged water, or water from which, e.g., metal ions, organic impurities, or particles are removed by a filter treatment or various adsorption treatments, and pure water or ultrapure water is especially preferred. As an additive, for example, various ligands or a chelating agent having an effect of improving the stability of the etching solution upon dissolution of copper ions can be used. Further, for example, for stabilizing the pH of the etching solution, a buffer can be used.

[Etching Method]

The etching method of the present invention is a method for etching copper or a compound comprised mainly of copper, and uses the etching solution of the present invention, typically, the etching solution containing the maleic acid ion source (A) and the copper ion source (B), and comprises the step of contacting an object to be etched with the etching solution of the present invention. By the etching method of the present invention, copper or a compound comprised mainly of copper can be etched.

<Object to be Etched>

In the etching method of the present invention, examples of copper or compounds comprised mainly of copper as an object to be etched include copper (metal), copper alloys, copper oxide which is an oxide thereof, and copper nitride which is a nitride thereof. Alternatively, copper (metal) having a native oxide film formed on the surface thereof may be used. With respect to the shape of the copper or compound comprised mainly of copper, there is no particular limitation, and the copper or compound comprised mainly of copper may be, e.g., of a thin film shape, a plate shape, a tubular shape, or a fibrous shape, and may be a structure having a complicated shape.

The copper or compound comprised mainly of copper may be a multilayer film comprising a thin film formed from copper or a compound comprised mainly of copper. The multilayer film may have a two-layer structure comprising a thin film formed from copper or a compound comprised mainly of copper and a thin film formed from molybdenum or a compound comprised mainly of molybdenum, or a three-layer structure comprising a thin film formed from molybdenum or a compound comprised mainly of molybdenum, a thin film formed from copper or a compound comprised mainly of copper, and a thin film formed from molybdenum or a compound comprised mainly of molybdenum. Especially preferred is a three-layer film having a thin film formed from molybdenum or a compound comprised mainly of molybdenum, a thin film formed from copper or a compound comprised mainly of copper, and a thin film formed from molybdenum or a compound comprised mainly of molybdenum, which films are laminated in this order, from the viewpoint of effectively exhibiting the performance of the etching solution of the present invention. Examples of molybdenum or compounds comprised mainly of molybdenum include molybdenum metal, molybdenum alloys, and oxides and nitrides thereof.

For example, a thin film formed from copper or a compound comprised mainly of copper is formed on a substrate, such as glass, and further a resist is applied to the thin film, and a desired pattern mask is transferred by exposure, followed by development, to form a desired resist pattern, and the resultant material is used as an object to be etched. Alternatively, for example, a resist is applied to a two-layer film having laminated a thin film formed from copper or a compound comprised mainly of copper and a thin film formed from molybdenum or a compound comprised mainly of molybdenum, or a three-layer film having laminated a layer formed from molybdenum or a compound comprised mainly of molybdenum, a layer formed from copper or a compound comprised mainly of copper, and a layer formed from molybdenum or a compound comprised mainly of molybdenum, and a desired pattern mask is transferred by exposure, followed by development, to form a desired resist pattern, and the resultant material is used as an object to be etched. Such a multilayer thin film comprising copper or a compound comprised mainly of copper is preferably used in a wiring for, e.g., a display device, such as a flat panel display.

<Etching Operation>

With respect to the method for contacting an object to be etched with the etching solution, there is no particular limitation, and, for example, a wet etching method, such as a method of immersing an object to be etched in the etching solution, or a method of contacting an object to be etched with the etching solution by a process, such as dropwise application (single wafer spin processing) or spraying, can be employed. In the present invention, a method of immersing an object to be etched in the etching solution or a method of contacting an object to be etched with the etching solution by spraying is preferably employed. As examples of the methods of contacting an object to be etched with the etching solution by spraying, there can be mentioned a method in which the etching solution is sprayed downwardly from the upside of the object and a method in which the etching solution is sprayed upwardly from the downside of the object. In these methods, the spray nozzle may be either fixed or moved, e.g., swung or slid. The spray nozzle may be either placed downward as viewed in the vertical or placed at an angle. The object to be etched may be either fixed or moved, e.g., rocked or rotated. The object to be etched may be either arranged horizontally or arranged at an angle.

The temperature at which the etching solution is used is preferably a temperature in the range of from 10 to 70° C., further preferably 15 to 60° C., especially preferably 20 to 50° C. When the temperature of the etching solution is 10° C. or higher, the etching rate becomes excellent, so that excellent production efficiency can be obtained. On the other hand, when the temperature of the etching solution is 70° C. or lower, a change of the etching solution in composition can be suppressed to keep the etching conditions constant. By increasing the temperature of the etching solution, the etching rate is increased, but a suitable temperature for treatment may be appropriately determined, taking into consideration the suppression of a change of the composition of the etching solution caused by, e.g., evaporation of water.

EXAMPLES

Hereinbelow, the present invention will be described in more detail with reference to the following Examples, which should not be construed as limiting the scope of the present invention.

Reference Example 1

Preparation of a Molybdenum (Mo)/Copper (Cu)/Molybdenum (Mo)/Glass Substrate

Molybdenum was sputtered to form a thin film comprised of molybdenum (metal) (molybdenum film thickness: 200 Å) on a glass substrate (size: 150 mm×150 mm), and then copper was sputtered to form a thin film comprised of copper (metal) (copper film thickness: 5,000 Å), and further molybdenum was sputtered to form a thin film comprised of molybdenum (metal) (molybdenum film thickness: 200 Å), obtaining a three-layer metal thin film structure. Then, a resist was applied to the resultant film, and a line-form pattern mask (line width: 20 µm) was transferred by exposure, followed by development, to prepare a molybdenum/copper/molybdenum/glass substrate.

Reference Example 2

Preparation of a Copper (Cu)/Molybdenum (Mo)/Glass Substrate

Molybdenum was sputtered to form a thin film comprised of molybdenum (metal) (molybdenum film thickness: 200 Å) on a glass substrate (size: 150 mm×150 mm), and then copper was sputtered to form a thin film comprised of copper (metal) (copper film thickness: 5,000 Å), obtaining a two-layer metal thin film structure. Then, a resist was applied to the resultant film, and a line-form pattern mask (line width: 20 μm) was transferred by exposure, followed by development, to prepare a copper/molybdenum/glass substrate.

Example 1

In a polypropylene container having a capacity of 10 L were placed 500 g of maleic acid (a special grade reagent, manufactured by Wako Pure Chemical Industries, Ltd.; molecular weight: 116.1) (4.3 mol, in terms of maleic acid ions) as a maleic acid ion source and 7,000 g of pure water. The resultant mixture was stirred and the dissolution of maleic acid was confirmed. Subsequently, to the resultant solution were added 782 g of copper(II) sulfate pentahydrate (a special grade reagent, manufactured by Wako Pure Chemical Industries, Ltd.; molecular weight: 249.7) (3.1 mol, in terms of copper ions) as a copper ion source and 1,718 g of pure water. The resultant mixture was stirred to dissolve copper(II) sulfate, preparing an etching solution (total weight of the etching solution was 10 kg). The maleic acid ion concentration of the obtained etching solution was 0.43 mol/kg-etching solution, the copper ion concentration of the etching solution was 0.31 mol/kg-etching solution, the ratio (molar ratio) of the amount of maleic acid ions to the amount of copper ions was 1.4, and the pH value was 1.1.

The molybdenum/copper/molybdenum/glass substrate obtained in Reference Example 1 was subjected to spray treatment at 35° C. with the above-obtained etching solution using a small-size etching machine (manufactured by Kanto Machine Industry Co., Ltd.). The molybdenum/copper/molybdenum/glass substrate was horizontally arranged so that the deposited film surface was the top (and the substrate was rocked in the horizontal direction), and the spray nozzle was fixed so as to point downward as viewed in the vertical (and so as not to be swung). As the spray nozzle, a nozzle having a uniform spray application (flow rate distribution) (and having a circular spray pattern) was used. A period of time required until the portion of the molybdenum/copper/molybdenum laminated film, which was not covered with the resist, disappeared and the transparent glass substrate was exposed (just etching time) was visually checked. As a result, the just etching time was found to be 99 seconds. The result is shown in Table 1. The molybdenum/copper/molybdenum/glass substrate was subjected to spray treatment for a period of time 1.5 time the just etching time (i.e., for 149 seconds) (50% over etching conditions), and then observed using an optical microscope. The result of the observation confirmed that the exposed molybdenum/copper/molybdenum laminated film other than the portion covered with the patterned resist completely disappeared.

The spray-treated molybdenum/copper/molybdenum/glass substrate was immersed in N-methylpyrrolidone at 60° C. for 300 seconds to remove the resist, and then observed using an optical microscope. The result of the observation confirmed that the molybdenum/copper/molybdenum laminated film which had been covered with the resist remained on the glass substrate. No etching residue was found on the glass substrate. Consequently, the molybdenum/copper/molybdenum laminated film was able to be etched into a desired pattern.

Examples 2 and 3

An etching solution was prepared in substantially the same manner as in Example 1 except that, instead of 1,718 g of pure water finally added in Example 1, as a pH adjustor, 851 g of sulfuric acid (concentration: 47% by mass; manufactured by Wako Pure Chemical Industries, Ltd.) and 867 g of pure water were added. The prepared etching solution had a pH value of 0.3 (Example 2).

Separately, an etching solution was prepared in substantially the same manner as in Example 1 except that, instead of 1,718 g of pure water finally added in Example 1, as a pH adjustor, 369 g of an aqueous potassium hydroxide solution (concentration: 48% by mass; manufactured by Kanto Chemical Co., Inc.) and 1,349 g of pure water were added. The prepared etching solution had a pH value of 2.0 (Example 3).

Using these etching solutions, etching of the molybdenum/copper/molybdenum/glass substrate was conducted. As a result, in all the cases using these etching solutions, the molybdenum/copper/molybdenum laminated film was able to be etched into a desired pattern. The results are shown in Table 1.

Examples 4 to 7

An etching solution was prepared in substantially the same manner as in Example 1 except that, as component (C), 383 g of citric acid monohydrate (a special grade reagent, manufactured by Wako Pure Chemical Industries, Ltd.; molecular weight: 210.1) (the citric acid concentration was 0.18 mol/kg-etching solution) was added. The prepared etching solution had a pH value of 1.1 (Example 4). In Examples 5 to 7, etching solutions were individually prepared in substantially the same manner as in Example 4 except that, as a pH adjustor, an aqueous potassium hydroxide solution (concentration: 48% by mass; manufactured by Kanto Chemical Co., Inc.) or an aqueous tetramethylammonium hydroxide solution (concentration: 15% by mass; manufactured by Wako Pure Chemical Industries, Ltd.) was further used, and that the pH value was changed to the values shown in Table 1 (pH values of the respective etching solutions were 3.0, 5.0, and 5.5). Using these etching solutions, etching of the molybdenum/copper/molybdenum/glass substrate was conducted. As a result, in all the cases using these etching solutions, the molybdenum/copper/molybdenum laminated film was able to be etched into a desired pattern. The results are shown in Table 1.

Examples 8 to 16

Etching solutions were individually prepared in substantially the same manner as in Example 1 except that the composition of the etching solution in Example 1 was changed to the values shown in Table 1, that, as a pH adjustor, an aqueous potassium hydroxide solution (concentration: 48% by mass; manufactured by Kanto Chemical Co., Inc.) or aqueous ammonia (concentration: 10% by mass; manufactured by Wako Pure Chemical Industries, Ltd.) was used, and that the pH value was changed to the values shown in Table 1. The molar ratios of maleic acid ions to copper ions in the respective etching solutions were 0.1, 1.4, 2.8, 5.5, 13.8, 27.5, and 45.8. Using these etching solutions, etching of the molybdenum/copper/molybdenum/glass substrate was conducted. As a result, in all the cases using these etching solutions, the molybdenum/copper/molybdenum laminated film was able to be etched into a desired pattern. The results are shown in Table 1.

In Example 15, aqueous ammonia was used as a pH adjustor, and the total of the ammonia concentration from the pH adjustor and the ammonium ion concentration was 0.85 mol/kg-etching solution. Further, there was no odor of ammonia from the etching solution.

Examples 17 and 18

Etching solutions were individually prepared in substantially the same manner as in Example 9 except that, as shown in Table 1, instead of maleic acid, maleic anhydride (manufactured by Wako Pure Chemical Industries, Ltd.) (Example 17) or disodium maleate (manufactured by Tokyo Chemical Industry Co., Ltd.) (Example 18) was used. Using these etching solutions, etching of the molybdenum/copper/molybdenum/glass substrate was conducted. As a result, in all the cases using these etching solutions, the molybdenum/copper/molybdenum laminated film was able to be etched into a desired pattern. The results are shown in Table 1.

Examples 19 and 20

Etching solutions were individually prepared in substantially the same manner as in Example 11 except that, as shown in Table 1, instead of copper(II) sulfate pentahydrate, copper(II) nitrate trihydrate (manufactured by Wako Pure Chemical Industries, Ltd.) (Example 19) or copper(II) hydroxide (manufactured by Wako Pure Chemical Industries, Ltd.) (Example 20) was used. When copper hydroxide was used, for chemically dissolving the copper hydroxide, sulfuric acid (the sulfuric acid concentration was 0.04 mol/kg-etching solution) was added during the preparation of the solution. Using these etching solutions, etching of the molybdenum/copper/molybdenum/glass substrate obtained in Reference Example 1 was conducted. As a result, in all the cases using these etching solutions, the molybdenum/copper/molybdenum laminated film was able to be etched into a desired pattern. A period of time required until the portion of the molybdenum/copper/molybdenum laminated film, which was not covered with the resist, disappeared and the transparent glass substrate was exposed (just etching time) was visually checked. As a result, it was found that the just etching time in Example 19 was 103 seconds and that in Example 20 was 79 seconds. The results are shown in Table 1.

TABLE 1

| Example No. | Component (A) | [mol/kg] | Component (B) | [mol/kg] | (A)/(B) (Molar ratio) | Component (C) | [mol/kg] | pH Adjustor | pH Value | Just etching time [sec] |
|---|---|---|---|---|---|---|---|---|---|---|
| 1 | Maleic acid | 0.43 | Copper sulfate pentahydrate | 0.31 | 1.4 | — | | — | 1.1 | 99 |
| 2 | Maleic acid | 0.43 | Copper sulfate pentahydrate | 0.31 | 1.4 | — | | Sulfuric acid | 0.3 | 158 |
| 3 | Maleic acid | 0.43 | Copper sulfate pentahydrate | 0.31 | 1.4 | — | | Potassium hydroxide | 2.0 | 45 |
| 4 | Maleic acid | 0.43 | Copper sulfate pentahydrate | 0.31 | 1.4 | Citric acid monohydrate | 0.18 | — | 1.1 | 126 |
| 5 | Maleic acid | 0.43 | Copper sulfate pentahydrate | 0.31 | 1.4 | Citric acid monohydrate | 0.18 | Potassium hydroxide | 3.0 | 106 |
| 6 | Maleic acid | 0.43 | Copper sulfate pentahydrate | 0.31 | 1.4 | Citric acid monohydrate | 0.18 | Tetramethyl ammonium hydroxide | 5.0 | 209 |
| 7 | Maleic acid | 0.43 | Copper sulfate pentahydrate | 0.31 | 1.4 | Citric acid monohydrate | 0.18 | Potassium hydroxide | 5.5 | 194 |
| 8 | Maleic acid | 0.04 | Copper sulfate pentahydrate | 0.31 | 0.1 | Citric acid monohydrate | 0.18 | Potassium hydroxide | 5.0 | 284 |
| 9 | Maleic acid | 0.09 | Copper sulfate pentahydrate | 0.06 | 1.4 | Citric acid monohydrate | 0.03 | Potassium hydroxide | 5.0 | 188 |
| 10 | Maleic acid | 0.43 | Copper sulfate pentahydrate | 0.16 | 2.8 | Citric acid monohydrate | 0.09 | Potassium hydroxide | 5.5 | 234 |
| 11 | Maleic acid | 0.86 | Copper sulfate pentahydrate | 0.16 | 5.5 | Citric acid monohydrate | 0.09 | Potassium hydroxide | 4.0 | 137 |
| 12 | Maleic acid | 0.86 | Copper sulfate pentahydrate | 0.06 | 13.8 | Citric acid monohydrate | 0.03 | Potassium hydroxide | 5.0 | 205 |
| 13 | Maleic acid | 0.86 | Copper sulfate pentahydrate | 0.06 | 13.8 | Citric acid monohydrate | 0.04 | Potassium hydroxide | 7.0 | 308 |
| 14 | Maleic acid | 0.86 | Copper sulfate pentahydrate | 0.03 | 27.5 | Citric acid monohydrate | 0.02 | Potassium hydroxide | 5.0 | 330 |
| 15 | Maleic acid | 0.86 | Copper sulfate pentahydrate | 0.03 | 27.5 | Citric acid monohydrate | 0.02 | Ammonia | 5.0 | 317 |
| 16 | Maleic acid | 0.86 | Copper sulfate pentahydrate | 0.02 | 45.8 | Citric acid monohydrate | 0.01 | Potassium hydroxide | 5.0 | 321 |
| 17 | Maleic anhydride | 0.09 | Copper sulfate pentahydrate | 0.06 | 1.4 | Citric acid monohydrate | 0.03 | Potassium hydroxide | 5.0 | 184 |
| 18 | 2Na maleate | 0.09 | Copper sulfate pentahydrate | 0.06 | 1.4 | Citric acid monohydrate | 0.03 | Potassium hydroxide | 5.0 | 188 |
| 19 | Maleic acid | 0.86 | Copper nitrate trihydrate | 0.16 | 5.5 | Citric acid monohydrate | 0.09 | Potassium hydroxide | 4.0 | 103 |
| 20 | Maleic acid | 0.86 | Copper hydroxide | 0.16 | 5.5 | Citric acid monohydrate | 0.09 | Potassium hydroxide | 4.0 | 79 |

Examples 21 and 22

Using the etching solutions in Examples 7 and 14, the copper/molybdenum/glass substrate obtained in Reference Example 2 was subjected to spray treatment at 35° C. with each of the etching solutions using a small-size etching machine (manufactured by Kanto Machine Industry Co., Ltd.). The copper/molybdenum/glass substrate was horizontally arranged so that the deposited film surface was the top (and the substrate was rocked in the horizontal direction), and the spray nozzle was fixed so as to point downward as viewed in the vertical (and so as not to be swung). As the spray nozzle, a nozzle having a uniform spray application (flow rate distribution) (and having a circular spray pattern) was used. The spray-treated copper/molybdenum/glass substrate was observed using an optical microscope. The result of the observation confirmed that the exposed copper/molybdenum laminated film other than the portion covered with the patterned resist completely disappeared. The spray-treated copper/molybdenum/glass substrate was immersed in N-methylpyrrolidone at 60° C. for 300 seconds to remove the resist, and then observed using an optical microscope. The result of the observation confirmed that the copper/molybdenum laminated film which had been covered with the resist remained on the glass substrate. Consequently, the copper/molybdenum laminated film was able to be etched into a desired pattern. A period of time required until the portion of the copper/molybdenum laminated film, which was not covered with the resist, disappeared and the transparent glass substrate was exposed (just etching time) was visually checked. As a result, it was found that the just etching time for the etching solution in Example 7 was 194 seconds (Example 21) and that for the etching solution in Example 14 was 305 seconds (Example 22). The results are shown in Table 2.

Example 23

An etching solution was prepared in substantially the same manner as in Example 15 except that, as an ammonia and/or ammonium ion source (D), ammonium sulfate (manufactured by Wako Pure Chemical Industries, Ltd.) was added in an amount of 0.11 mol/kg-etching solution and the composition of the etching solution in Example 15 was changed to the composition shown in Table 3, and that the pH value was changed to the value shown in Table 3. The ammonia concentration and ammonium ion concentration were 1.68 mol/kg-etching solution which corresponds to the total of 0.22 mol/kg-etching solution, which is two times the amount of ammonium sulfate, and 1.46 mol/kg-etching solution derived from the aqueous ammonia used as a pH adjustor. Using the etching solution, etching of the molybdenum/copper/molybdenum/glass substrate prepared in Reference Example 1 was conducted. A period of time required until the portion of the molybdenum/copper/molybdenum laminated film, which was not covered with the resist, disappeared and the transparent glass substrate was exposed (just etching time) was visually checked. As a result, the just etching time was found to be 185 seconds. Further, there was no odor of ammonia from the etching solution.

TABLE 3

| Example No. | Component (A) [mol/kg] | Component (B) [mol/kg] | (A)/(B) (Molar ratio) | Component (C) [mol/kg] | pH Adjustor | pH Value | Component (D) [mol/kg] | Just etching time [sec] |
|---|---|---|---|---|---|---|---|---|
| 23 | Maleic acid 0.86 | Copper sulfate pentahydrate 0.03 | 27.5 | Citric acid monohydrate 0.02 | Ammonia | 5.5 | Ammonium sulfate 0.11 | 185 |

Example 24

An etching solution was prepared in substantially the same manner as in Example 13 except that, as a molybdenum and/or molybdic acid ion source (E), hexaammonium heptamolybdate tetrahydrate was added in an amount of 0.03 mol/kg-etching solution, in terms of orthomolybdic acid ions, and the composition of the etching solution in Example 13 was changed to the composition shown in Table 4. Using the etching solution, etching of the molybdenum/copper/molybdenum/glass substrate prepared in Reference Example 1 was conducted. A period of time required until the portion of the molybdenum/copper/molybdenum laminated film, which was not covered with the resist, disappeared and the transparent glass substrate was exposed (just etching time) was visually checked. As a result, the just etching time was found to be 94 seconds.

TABLE 2

| Example No. | Component (A) | [mol/kg] | Component (B) | [mol/kg] | (A)/(B) (Molar ratio) | Component (C) | [mol/kg] | pH Adjustor | pH Value | Just etching time [sec] |
|---|---|---|---|---|---|---|---|---|---|---|
| 21 | Maleic acid | 0.43 | Copper sulfate pentahydrate | 0.31 | 1.4 | Citric acid monohydrate | 0.18 | Potassium hydroxide | 5.5 | 194 |
| 22 | Maleic acid | 0.86 | Copper sulfate pentahydrate | 0.03 | 27.5 | Citric acid monohydrate | 0.02 | Potassium hydroxide | 5.0 | 305 |

TABLE 4

| Example No. | Component (A) [mol/kg] | Component (B) [mol/kg] | (A)/(B) (Molar ratio) | Component (C) [mol/kg] | pH Adjustor | pH Value | Component (E) [mol/kg] | Just etching time [sec] |
|---|---|---|---|---|---|---|---|---|
| 24 | Maleic acid 0.86 | Copper sulfate pentahydrate 0.06 | 13.8 | Citric acid monohydrate 0.18 | Potassium hydroxide | 7.0 | Hexaammonium heptamolybdate tetrahydrate 0.03 | 94 |

In each of the cases using the etching solutions in Examples 1 to 24, a spray treatment was conducted for a period of time 1.5 time the just etching time for each etching solution (50% over etching conditions), and the results confirmed that no etching residue remained and the etching solutions had excellent etching rate.

Comparative Examples 1 to 6

Etching solutions were individually prepared in substantially the same manner as in Example 1 except that the composition and pH value of the etching solution in Example 1 were changed to the values shown in Table 5. Using these etching solutions, etching of the molybdenum/copper/molybdenum/glass substrate obtained in Reference Example 1 was conducted in the same manner as in Example 1. The molybdenum/copper/molybdenum/glass substrate was subjected to spray treatment at 35° C. for 600 seconds and then observed using an optical microscope. As a result, in all the cases using these etching solutions, the molybdenum/copper/molybdenum laminated film did not completely disappear and etching residue was found.

TABLE 5

| Comparative Example No. | Component (A) | [mol/kg] | Component (B) | [mol/kg] | (A)/(B) (Molar ratio) | Component (C) | [mol/kg] | pH Adjustor | pH Value | Just etching time [sec] |
|---|---|---|---|---|---|---|---|---|---|---|
| 1 | Maleic acid | 0.43 | — | — | — | — | — | — | 1.1 | >600 Residue existed |
| 2 | Maleic acid | 0.43 | — | — | — | — | — | Potassium hydroxide | 5.5 | >600 Residue existed |
| 3 | — | — | Copper sulfate pentahydrate | 0.31 | — | — | — | Sulfuric acid | 1.1 | >600 Residue existed |
| 4 | — | — | Copper sulfate pentahydrate | 0.31 | — | — | — | — | 3.8 | >600 Residue existed |
| 5 | — | — | Copper sulfate pentahydrate | 0.31 | — | Citric acid monohydrate | 0.18 | Sulfuric acid | 1.1 | >600 Residue existed |
| 6 | — | — | Copper sulfate pentahydrate | 0.31 | — | Citric acid monohydrate | 0.18 | Potassium hydroxide | 5.5 | >600 Residue existed |

Comparative Examples 7 to 11

Etching solutions were individually prepared in substantially the same manner as in Example 1 except that the composition and pH value of the etching solution in Example 1 were changed to the values shown in Table 6. In each of Comparative Examples 7, 8, and 9 in which succinic acid, fumaric acid, or phthalic acid was added instead of the maleic acid ion source (A), an insoluble material remained, so that an etching solution was not able to be prepared. Using the etching solutions in Comparative Examples 10 and 11 having added lactic acid or acetic acid instead of the maleic acid ion source (A), etching of the molybdenum/copper/molybdenum/glass substrate obtained in Reference Example 1 was conducted in the same manner as in Example 1. As a result of a spray treatment at 35° C. for 600 seconds, in all the cases using these etching solutions, the molybdenum/copper/molybdenum laminated film did not completely disappear and etching residue was found.

TABLE 6

| Comparative Example No. | Organic acid other than maleic acid | [mol/kg] | Component (B) | [mol/kg] | Organic acid other than maleic acid/(B) (Molar ratio) | Component (C) | [mol/kg] | pH Adjustor | pH Value | Just etching time [sec] |
|---|---|---|---|---|---|---|---|---|---|---|
| 7 | Succinic acid | 0.42 | Copper sulfate pentahydrate | 0.31 | 1.4 | Citric acid monohydrate | 0.18 | Potassium hydroxide | 4.0 | Cannot be prepared |

TABLE 6-continued

| Comparative Example No. | Organic acid other than maleic acid | [mol/kg] | Component (B) | [mol/kg] | Organic acid other than maleic acid/(B) (Molar ratio) | Component (C) | [mol/kg] | pH Adjustor | pH Value | Just etching time [sec] |
|---|---|---|---|---|---|---|---|---|---|---|
| 8 | Fumaric acid | 0.43 | Copper sulfate pentahydrate | 0.31 | 1.4 | Citric acid monohydrate | 0.18 | Potassium hydroxide | 4.0 | Cannot be prepared |
| 9 | Phthalic acid | 0.30 | Copper sulfate pentahydrate | 0.31 | 1.0 | Citric acid monohydrate | 0.18 | Potassium hydroxide | 4.0 | Cannot be prepared |
| 10 | Lactic acid | 0.56 | Copper sulfate pentahydrate | 0.31 | 1.8 | Citric acid monohydrate | 0.18 | Potassium hydroxide | 4.0 | >600 Residue existed |
| 11 | Acetic acid | 0.83 | Copper sulfate pentahydrate | 0.31 | 2.7 | Citric acid monohydrate | 0.18 | Potassium hydroxide | 4.0 | >600 Residue existed |

INDUSTRIAL APPLICABILITY

The etching solution of the present invention can be advantageously used in etching a multilayer structure comprising copper or a compound comprised mainly of copper. Such a multilayer structure comprising copper or a compound comprised mainly of copper is preferably used in a wiring for a display device, such as a flat panel display. The etching method using the etching solution is advantageous not only in that a wiring having a multilayer structure comprising copper or a compound comprised mainly of copper and molybdenum or a compound comprised mainly of molybdenum can be etched at the same time, but also in that no etching residue is caused, making it possible to achieve high productivity.

The invention claimed is:

1. An etching method, comprising:
   etching an object comprising copper or a compound comprised mainly of copper by contacting the object with an etching solution comprising:
   (A) a maleic acid ion source,
   (B) a copper ion source, and
   (C) a source of an organic acid ion comprising two or more carboxyl groups and one or more hydroxyl groups per molecule,
   wherein
   the source of the organic acid ion comprising two or more carboxyl groups and one or more hydroxyl groups per molecule (C) is at least one selected from the group consisting of citric acid, malic acid, and a salt thereof, and
   the etching solution does not comprise tartaric acid, a halide ion, or hydrogen peroxide.

2. The etching method of claim 1, wherein the maleic acid ion source (A) is at least one selected from the group consisting of maleic acid, maleic anhydride, and an alkali metal maleate.

3. The etching method of claim 1, wherein the copper ion source (B) is at least one selected from the group consisting of copper, copper hydroxide, copper sulfate, and copper nitrate.

4. The etching method of claim 1, wherein a concentration of maleic acid ion in the etching solution is 0.01 to 2 mol/kg, a concentration of copper ion in the etching solution is 0.01 to 1 mol/kg, and a molar ratio of the concentration of maleic acid ion to the concentration of copper ion is in a range of 0.01 to 50.

5. The etching method of claim 1, wherein a molar ratio of an amount of the source of the organic acid ion comprising two or more carboxyl groups and one or more hydroxyl groups per molecule (C) to an amount of the copper ion source (B) is in a range of 0.1 to 2.0.

6. The etching method of claim 1, wherein the etching solution further comprises a pH adjustor.

7. The etching method of claim 1, wherein the etching solution has a pH of 0 to 9.

8. The etching method of claim 1, wherein the etching solution further comprises (D) an ammonia source, an ammonium ion source, or both.

9. The etching method of claim 1, wherein the etching solution further comprises (E) a molybdenum source, a molybdic acid ion source, or both.

10. The etching method according to claim 1, wherein
    the object is a film comprising copper or the compound comprised mainly of copper, and
    the film constitutes one layer of a multilayer film.

11. The etching method according to claim 10, wherein the multilayer film
    has a two-layer structure comprising the film comprising copper or the compound comprised mainly of copper and a film comprising molybdenum or a compound comprised mainly of molybdenum, or
    has a three-layer structure comprising a first film comprising molybdenum or a compound comprised mainly of molybdenum, the film comprising copper or the compound comprised mainly of copper, and a second film comprising molybdenum or a compound comprised mainly of molybdenum.

* * * * *